US008846518B2

United States Patent
Zhang et al.

(10) Patent No.: US 8,846,518 B2
(45) Date of Patent: Sep. 30, 2014

(54) MULTILAYER CONSTRUCTION

(75) Inventors: Jun-Ying Zhang, Woodbury, MN (US);
Michael A. Haase, St. Paul, MN (US);
Todd A. Ballen, St. Paul, MN (US);
Terry L. Smith, Roseville, MN (US)

(73) Assignee: 3M Innovative Properties Company,
St. Paul, MN (US)

( * ) Notice: Subject to any disclaimer, the term of this patent is extended or adjusted under 35 U.S.C. 154(b) by 0 days.

(21) Appl. No.: 13/805,825

(22) PCT Filed: Jun. 1, 2011

(86) PCT No.: PCT/US2011/038676
§ 371 (c)(1),
(2), (4) Date: Dec. 20, 2012

(87) PCT Pub. No.: WO2012/009061
PCT Pub. Date: Jan. 19, 2012

(65) Prior Publication Data
US 2013/0109183 A1    May 2, 2013

Related U.S. Application Data

(60) Provisional application No. 61/359,027, filed on Jun. 28, 2010.

(51) Int. Cl.
| | | |
|---|---|---|
| *H01L 21/3205* | (2006.01) | |
| *H01L 21/311* | (2006.01) | |
| *C23C 16/34* | (2006.01) | |
| *H01L 21/306* | (2006.01) | |
| *H01L 33/46* | (2010.01) | |
| *C23C 16/02* | (2006.01) | |
| *B82Y 20/00* | (2011.01) | |
| *C23C 14/02* | (2006.01) | |
| *H01L 21/46* | (2006.01) | |
| *C23C 14/06* | (2006.01) | |
| *H01S 5/347* | (2006.01) | |
| *G02B 6/44* | (2006.01) | |
| *H01S 5/183* | (2006.01) | |
| *H01L 33/28* | (2010.01) | |

(52) U.S. Cl.
CPC .......... *H01L 21/30604* (2013.01); *H01S 5/347* (2013.01); *C23C 16/345* (2013.01); *H01L 33/46* (2013.01); *G02B 6/4439* (2013.01); *C23C 16/0227* (2013.01); *B82Y 20/00* (2013.01); *C23C 14/021* (2013.01); *H01S 5/18369* (2013.01); *H01L 21/46* (2013.01); *H01L 33/28* (2013.01); *C23C 14/0652* (2013.01)
USPC ........... 438/602; 438/603; 438/604; 438/694; 438/695

(58) Field of Classification Search
None
See application file for complete search history.

(56) References Cited

U.S. PATENT DOCUMENTS 4,181,751 A    1/1980 Hall
(Continued)

OTHER PUBLICATIONS

Chavan, et al., *Surface Passivation and Capping of GaSb Photodiode by Chemical Bath Deposition of CdS*, Journal of Applied Physics, American Institute of Physics, vol. 100, No. 6, p. 64512, Sep. 29, 2006.

Deen et al., *Low-Frequency Noise in Cadmium—Selenide Thin-Film Transistors*, Applied Physics Letters, AIP, American Institute of Physics, vol. 77, No. 14, pp. 2234-2236, Oct. 2, 2000.

Ohtsuka et al., *Low Resistance OHMIC Contact for P-Type ZnTe Using Au Electrode*, Applied Phusics Letters, AIP, American Institute of Physics, vol. 67, No. 9, pp. 1277-1279, Aug. 28, 1995.

(Continued)

*Primary Examiner* — Duy Deo
(74) *Attorney, Agent, or Firm* — Yufeng Dong; Daniel J. Iden; Kristofor L. Storvick

(57) ABSTRACT

A multilayer construction is disclosed. The multilayer construction includes a -II-VI semiconductor layer (110)x and a $Si_3N_4$ layer (120) disposed directly on the II-VI semiconductor layer. To improve the adhesion of the Si3N4 layer (120) a native oxide on the II-VI semiconductor layer is removed.

14 Claims, 3 Drawing Sheets

(56) References Cited

U.S. PATENT DOCUMENTS

| | | | | |
|---|---|---|---|---|
| 4,590,091 | A | | 5/1986 | Rogers, Jr. |
| 4,711,767 | A | * | 12/1987 | Diederich ............... 422/186.29 |
| 4,978,577 | A | | 12/1990 | Purohit |
| 5,194,119 | A | | 3/1993 | Iwano |
| 6,787,397 | B2 | | 9/2004 | Swanson |
| 7,202,568 | B2 | * | 4/2007 | Seshan et al. ................ 257/760 |
| 2009/0325359 | A1 | * | 12/2009 | Liu et al. ...................... 438/424 |

OTHER PUBLICATIONS

International Application PCT/US2011/038676 International Search Report dated Sep. 2, 2011.

International Application PCT/US2011/038676 Written Opinion dated Sep. 2, 2011.

U.S. Appl. No. 61/359,027 to Zhang et al., filed Jun. 28, 2010, entitled *Multilayer Construction*.

* cited by examiner

MULTILAYER CONSTRUCTION

FIELD OF THE INVENTION

This invention generally relates to multilayer constructions. The invention is particularly applicable to multilayer constructions that include a semiconductor layer with improved adhesion to one or more neighboring dielectric layers.

BACKGROUND

Light emitting diodes (LEDs) are frequently employed as light sources in many different applications including projection display systems, backlights for liquid crystal displays, and the like. LEDs have improved brightness and operational lifetime as compared to conventional light sources. Some light sources include one or more LEDs and one or more multilayer semiconductor constructions for converting light emitted by the LEDs to longer wavelength light. Such semiconductor constructions, however, have limited lifetime due to, for example, poor adhesion between some of the layers within the semiconductor constructions.

SUMMARY OF THE INVENTION

Generally, the present invention is related to multilayer constructions. In one embodiment, a multilayer construction includes a II-VI semiconductor layer and a $Si_3N_4$ layer disposed directly on the II-VI semiconductor layer. In some cases, the interface between the II-VI semiconductor and $Si_3N_4$ layers does not include any oxide. In some cases, the interface between the II-VI semiconductor and $Si_3N_4$ layers includes an element from Group VIIIA of the Periodic Table of the Elements, where, in some cases, the atomic concentration of the Group VIIIA element at the interface between the II-VI semiconductor and $Si_3N_4$ layers is at least about 1%, or at least about 2%. In some cases, the II-VI semiconductor layer includes Mg, where the concentration of Mg in the II-VI semiconductor layer is at least about 30%, or at least about 40%, or at least about 50%, or at least about 60%. In some cases, the II-VI semiconductor layer includes CdMgZnSe. In some cases, the multilayer construction also includes an oxide layer disposed directly on the $Si_3N_4$ layer, where, in some cases, the oxide layer includes at least one of $SiO_2$, $TiO_2$ and SiON. In some cases, the multilayer construction also includes an adhesive layer disposed directly on the oxide layer, where, in some cases, the adhesive layer comprises silicone. In some cases, a semiconductor construction absorbs light at a first wavelength and converts at least a portion of the absorbed light to light at a longer second wavelength, where the semiconductor construction includes the multilayer construction. In some cases, a vertical cavity surface emitting laser (VCSEL) includes the multilayer construction.

In another embodiment, a multilayer construction includes a II-VI semiconductor layer and a dielectric layer disposed directly on the II-VI semiconductor layer, where the interface between the II-VI semiconductor and dielectric layers is oxide free. In some cases, the average thickness of any oxide layer at the interface between the II-VI semiconductor and dielectric layers is less than about 8 nanometers, or less than about 6 nanometers, or less than about 4 nanometers, or less than about 2 nanometers, or less than about 1 nanometer. In some cases, the dielectric layer includes $Si_3N_4$. In some cases, the interface between the II-VI semiconductor and dielectric layers includes an element from Group VIIIA of the Periodic Table of the Elements. In some cases, the II-VI semiconductor layer includes Mg, where, in some cases, the concentration of Mg in the II-VI semiconductor layer is at least about 30%, or at least about 40%, or at least about 50%, or at least about 60%. In some cases, the II-VI semiconductor layer includes CdMgZnSe. In some cases, the multilayer construction also includes an oxide layer disposed directly on the dielectric layer, where, in some cases, the oxide layer includes at least one of $SiO_2$, $TiO_2$, and SiON. In some cases, the multilayer construction also includes an adhesive layer disposed directly on the oxide layer, where, in some cases, the adhesive layer includes silicone. In some cases, a semiconductor construction absorbs light at a first wavelength and converts at least a portion of the absorbed light to light at a longer second wavelength, where the semiconductor construction includes the multilayer construction. In some cases, a VCSEL includes the multilayer construction.

In another embodiment, a method of fabricating a multilayer construction includes the steps of: (a) providing a II-VI semiconductor layer that includes a native oxide layer at a first major surface of the II-VI semiconductor layer; (b) removing the native oxide layer; (c) depositing an $Si_3N_4$ layer directly on the first major surface of the II-VI semiconductor layer. In some cases, the method also includes the step: (d) depositing an oxide layer directly on the $Si_3N_4$ layer. In some cases, step (b) includes an ion milling, or a reactive ion etching, or an inductive coupled plasma reactive ion etching, or a chemically assisted ion beam etching, or a sputtering, of the native oxide layer. In some cases, at least one of steps (c) and (d) includes chemical vapor deposition, or plasma enhanced chemical vapor deposition, or physical vapor deposition, or sputtering, or electron beam evaporation, or atomic layer deposition, or vapor phase epitaxy, or liquid phase epitaxy. In some cases, the oxide layer includes at least one of $SiO_2$, $TiO_2$, and SiON. In some cases, steps (a) through (c) are carried out sequentially. In some cases, steps (a) through (d) are carried out sequentially. In some cases, the method also includes the step of: (e) depositing an adhesive layer directly on the oxide layer. In some cases, steps (a) through (e) are carried out sequentially. In some cases, the adhesive layer includes silicone. In some cases, the method also includes the step of: (f) removing contaminants from the first major surface of the II-VI semiconductor layer. In some cases, the steps are carried out in the following order: (a), (f), (b), (c), and (d). In some cases, the contaminants include Se nodules. In some cases, step (f) includes an oxidizing etching process, such as an oxygen plasma etching process.

In another embodiment, a multilayer construction includes multiple stacks, where each stack includes an oxide layer disposed directly on a $Si_3N_4$ layer, and where the $Si_3N_4$ layer of one stack in the multiple stacks is disposed directly on a II-VI semiconductor layer. In some cases, the multilayer construction includes at least three stacks. In some cases, the oxide layer includes at least one of $SiO_2$, $TiO_2$, and SiON.

In another embodiment, a multilayer construction includes a first II-VI semiconductor layer, a second II-VI semiconductor layer disposed on the first II-VI semiconductor layer, a first $Si_3N_4$ layer disposed directly on the first II-VI semiconductor layer, and a second $Si_3N_4$ layer disposed directly on the second II-VI semiconductor layer. In some cases, the first interface between the first II-VI semiconductor and the first $Si_3N_4$ layers does not include any oxide, and the second interface between the second II-VI semiconductor and the second $Si_3N_4$ layers does not include any oxide. In some cases, the first interface between the first II-VI semiconductor and $Si_3N_4$ layers includes an element from Group VIIIA of the Periodic Table of the Elements, and the second interface between the second II-VI semiconductor and $Si_3N_4$ layers includes an element from Group VIIIA of the Periodic Table of the Elements.

In another embodiment, a multilayer construction includes a II-VI semiconductor construction that includes one or more II-VI semiconductor layers, a first outermost major surface having a II-VI semiconductor, and an opposing second outermost surface having a II-VI semiconductor. The multilayer construction also includes a first $Si_3N_4$ layer that is disposed directly on the first outermost major surface, and a second $Si_3N_4$ layer that is disposed directly on the second outermost major surface. In some cases, at least one of the first and second outermost major surfaces does not include any oxide. In some cases, the first and second outermost major surfaces do not include any oxide. In some cases, at least one of the first and second outermost major surfaces includes an element from Group VIIIA of the Periodic Table of the Elements. In some cases, the first and second outermost major surfaces include an element from Group VIIIA of the Periodic Table of the Elements.

BRIEF DESCRIPTION OF DRAWINGS

The invention may be more completely understood and appreciated in consideration of the following detailed description of various embodiments of the invention in connection with the accompanying drawings, in which.

The same reference numeral used in multiple figures refers to the same or similar elements having the same or similar properties and functionalities.

DETAILED DESCRIPTION

Figure 1:
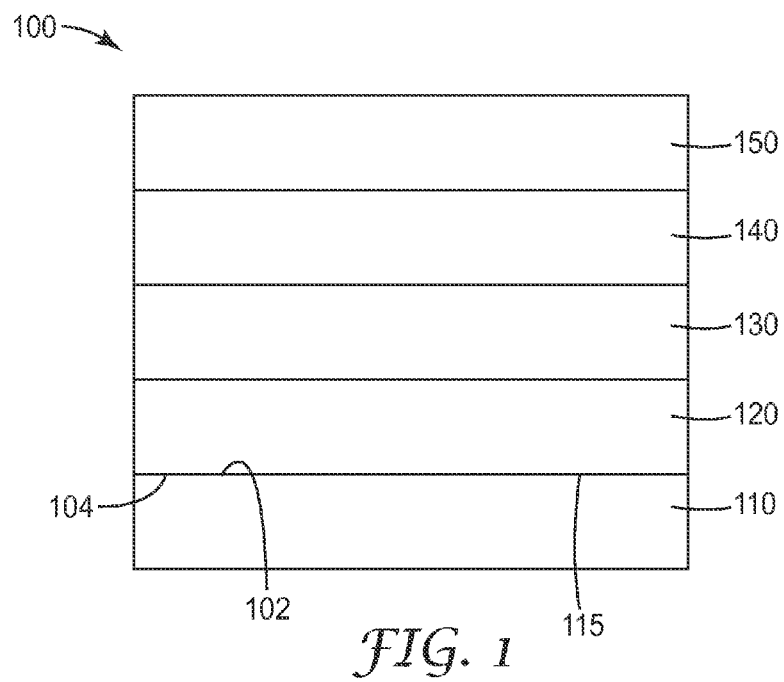
FIG. 1 is a schematic side-view of a multilayer construction.

This application discloses multilayer constructions that include one or more semiconductor layers and one or more dielectric layers, where the adhesion between the neighboring layers is improved due to one or more surface treatments. FIG. 1 is a schematic side-view of a multilayer construction 100 that includes a II-VI semiconductor layer 110, a $Si_3N_4$ (SiN) layer 120 that is disposed directly on II-VI semiconductor layer 110, an oxide layer 130 that is disposed directly on $Si_3N_4$ layer 120, an adhesive layer 140 that is disposed directly on oxide layer 130, and a substrate 150 that is disposed on adhesive layer 140. As used herein, a first layer is disposed directly on a second layer when there are no other layers disposed between the first and second layers and the first and second layers are directly and physically in contact with one another across major portions, such as at least 50%, or at least 60%, or at least 70%, or at least 80%, or at least 90%, of the two layers. For example, coating, such as wet or vapor coating, or growing, such as epitaxially growing, a second layer directly on a first layer results in the second layer being disposed directly on the first layer. As another example, adhering a second layer to a first layer via an adhesive layer results on the second layer being disposed indirectly on the first layer.

II-VI semiconductor layer 110 includes one or more II-VI semiconductors. The II-VI semiconductor can be any II-VI semiconductor that may be desirable in an application. For example, in some cases, the II-VI semiconductor layer can include CdMgZnSe or CdZnSe, or one or more CdMgZnSe alloys or material system including CdZnSe alloys or material system. In some cases, the II-VI semiconductor layer can include MgZnSeTe or ZnSeTe or one or more MgZnSeTe alloys or material system including ZnSeTe alloys or material system. In some cases, the II-VI semiconductor layer can include BeMgZnSe or BeZnSe or one or more BeMgZnSe alloys or material system including BeZnSe alloys or material system. In some cases, the II-VI semiconductor layer can include Mg, where the concentration of the Mg in the II-VI semiconductor layer is at least about 20%, or at least about 30%, or at least about 40%, or at least about 50%, or at least about 60%, or at least about 70%.

Figure 2:
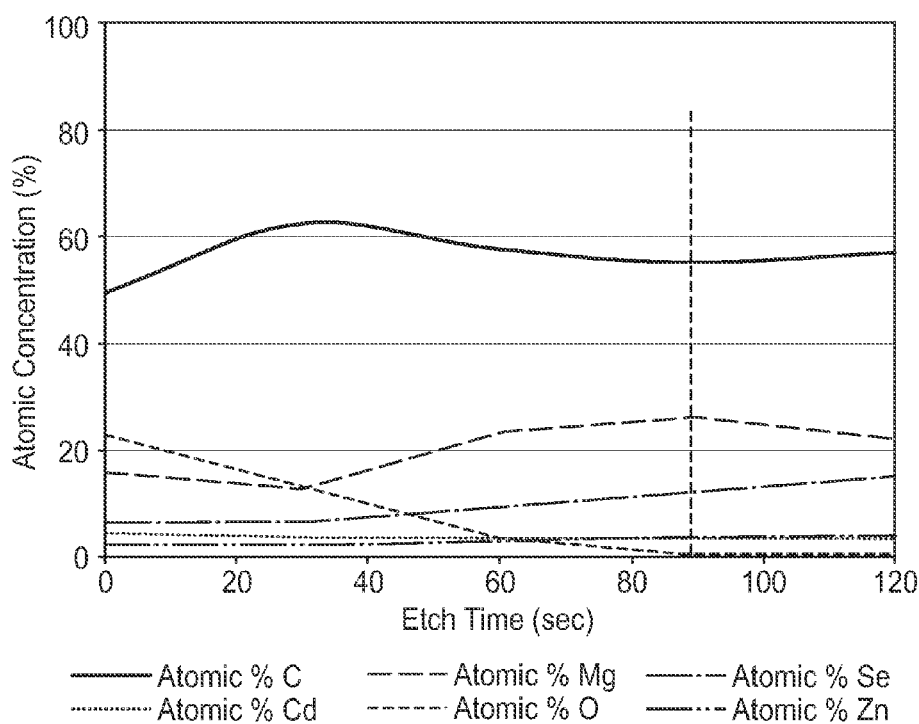
FIG. 2 is atomic concentration as a function of etch time.

In some cases, II-VI semiconductor layer 110 includes a native oxide layer at a top major surface 102 of II-VI semiconductor layer 110, where the native oxide layer is formed due to the oxidation of the top surface of the II-VI semiconductor layer and can, for example, include one or more of CdO, ZnO, MgO and $SeO_2$. For example, FIG. 2 is the atomic concentration at a top major surface 102 of a II-VI semiconductor layer 110 as the top major surface was etched using an argon sputtering process. The atomic concentration was determined using Electron Spectroscopy for Chemical Analysis (ESCA). The II-VI semiconductor layer was a 2 micron thick $Cd_{0.14}Mg_{0.56}Ze_{0.3}Se$ layer grown on an indium phosphide (InP) substrate using molecular beam epitaxy (MBE). The native oxide layer at top surface 102 was essentially removed after etching the top surface for about 90 seconds since, as shown in FIG. 2, the atomic concentration of oxygen at the top surface reduced to about zero after about 90 seconds of etching the top surface. The thickness of the native oxide layer was about 8 nanometers.

Referring back to FIG. 1, it has been found that the adhesion between $Si_3N_4$ layer 120 and II-VI semiconductor layer 110 is significantly improved when the native oxide layer of the II-VI semiconductor layer is removed before directly depositing the $Si_3N_4$ layer on the II-VI semiconductor layer. In such cases, an interface 115 between a bottom major surface 104 of the $Si_3N_4$ layer and top major surface 102 of the II-VI semiconductor layer, or between the $Si_3N_4$ and II-VI semiconductor layers, does not include any oxide and can be considered to be oxide free, meaning that the average thickness of any oxide layer at interface 115 between the $Si_3N_4$ and II-VI semiconductor layers is less than about 8 nanometers, or less than about 7 nanometers, or less than about 6 nanometers, or less than about 5 nanometers, or less than about 4 nanometers, or less than about 3 nanometers, or less than about 2 nanometers, or less than about 1 nanometer.

In general, $Si_3N_4$ layer 120 can be a dielectric layer 120. In such cases, interface 115 between a dielectric layer 120 and II-VI semiconductor layer 110 can be oxide free. In some cases, dielectric layer 120 can include $Si_3N_4$.

In general, the native oxide layer of II-VI semiconductor layer 110 can be removed using any appropriate removing or etching method, such as wet and dry etching methods. Exemplary dry etching methods include reactive ion etching (RIE) such as inductive coupled plasma (ICP) RIE, reactive ion beam etching (RIBE), chemically-assisted ion beam etching (CAIBE), ion milling, and plasma sputter etching. For example, a native oxide layer of a II-VI semiconductor layer 110 can be removed using a plasma etching process that utilizes nitrogen (N) or an element from Group VIIIA of the Periodic Table of the Elements, such as He, Ne, Ar, Kr or Xe. For example, the native oxide layer can be removed using an ICP plasma etching process where the RF power is in a range from about 20 W to about 200 W, the ICP power is in a range from about 700 W to about 2000 W, the pressure is about 4 mTorr to about 30 mTorr, and the gas flow is in a range from about 5 sccm to about 50 sccm. In some cases, such as when the native oxide layer is sufficiently thin, the RF power can be in a range from about 20 W to about 100 W and the ICP power can be in a range from about 700 W to about 1500 W.

It has been found that the adhesion between the $Si_3N_4$ and II-VI semiconductor layers can significantly increase if, prior to directly coating the II-VI semiconductor layer with the $Si_3N_4$ layer, the native oxide layer of the II-VI semiconductor is removed using a plasma etching process that utilizes nitrogen (N) or an element from Group VIIIA of the Periodic Table of the Elements. In such cases, it has been further found that the top surface of the II-VI semiconductor layer and the interface between the II-VI semiconductor and $Si_3N_4$ layers include a detectable or measurable quantity of the element used from Group VIIIA of the Periodic Table of the Elements.

For example, Table I lists the percentage surface atomic concentration of argon for two exemplary II-VI semiconductor layers 110 (designated as Samples A and B) the native oxide layers of which were not removed, and two exemplary II-VI semiconductor layers 110 (designated as Samples C and D) the native oxide layers of which were removed using an argon (Ar) ICP plasma etching process. Each of samples A-D was a 2 micron thick $Cd_{0.14}Mg_{0.56}Ze_{0.3}Se$ layer grown on an InP substrate using MBE. The ICP plasma etching process for etching Samples C and D was carried out at an RF power of about 30 W, an ICP power of about 1000 W, and a pressure of about 6 mTorr. The etch time was about 8 seconds for Sample C and about 30 seconds for Sample D.

TABLE I

Surface atomic concentration for exemplary II-VI semiconductor layers 110

| Sample | Argon Surface Atomic Concentration (%) |
| --- | --- |
| A | 0 |
| B | 0 |
| C | 2.9 |
| D | 3.4 |

Each of samples C and D was etched with argon plasma and included a measurable or detectable concentration of argon at the top surface of the sample. In some cases, when the native oxide layer of a II-VI semiconductor is removed using a plasma etching process that utilizes an element from Group VIIIA of the Periodic Table of the Elements, the resulting atomic concentration of the utilized Group VIIIA element at the interface between the II-VI semiconductor and $Si_3N_4$ layers, or at the top major surface of the II-VI semiconductor layer, is at least about 0.5%, or at least about 1%, or at least about 1.5%, or at least about 2%, or at least about 2.5%, or at least about 3%.

It has been further found that, the adhesion between oxide layer 130, such as an $SiO_2$ layer 130, and II-VI semiconductor layer 110 can be significantly increased if prior to depositing the oxide layer on the II-VI semiconductor layer, the native oxide layer of the II-VI semiconductor layer is removed and a thin $Si_3N_4$ layer 120 is directly deposited on the freshly exposed top surface of the II-VI semiconductor layer. In such cases, the thickness of the $Si_3N_4$ layer is in a range from about 2 nanometers to about 500 nanometers, or in a range from about 2 nanometers to about 100 nanometers, or in a range from about 2 nanometers to about 80 nanometers, or in a range from about 2 nanometers to about 60 nanometers, or in a range from about 2 nanometers to about 50 nanometers, or in a range from about 2 nanometers to about 40 nanometers, or in a range from about 2 nanometers to about 30 nanometers. In some cases, the thickness of the $Si_3N_4$ layer is about 20 nanometers.

Oxide layer 130 includes an oxide. The oxide can be any oxide that may be of interest in an application. In some cases, the oxide can be or include $SiO_2$, $TiO_2$, ZnO and/or $Al_2O_3$. In some cases, oxide layer 130 can include at least one of $SiO_2$ and $TiO_2$. In some cases, oxide layer 130 can include silicon oxynitride SiON.

Adhesive layer 140 includes an adhesive for adhering substrate 150 to oxide layer 130. Adhesive layer 140 can include any type adhesive that may be of interest in an application and is capable of providing sufficient adhesion between oxide layer 130 and substrate 150. Exemplary adhesives include pressure sensitive adhesives (PSAs), heat-sensitive adhesives, two-part adhesives, solvent-volatile adhesives, and UV-curable adhesives such as UV-curable optical adhesives available from Norland Products, Inc. Exemplary adhesives include those based on natural rubbers, synthetic rubbers, silicones, urethanes, styrene block copolymers, (meth)acrylic block copolymers, polyvinyl ethers, polyolefins, and poly (meth)acrylates. As used herein, (meth)acrylic (or acrylate) refers to both acrylic and methacrylic species. Exemplary silicone adhesives include a polymer or gum and an optional tackifying resin. Other exemplary silicone adhesives include a polydiorganosiloxane polyoxamide and an optional tackifier. In some cases, adhesive layer 140 includes silicone.

In some cases, adhesive layer 140 can be a structural adhesive. Generally, useful structural adhesives contain reactive materials that cure to form a strong adhesive bond. The structural adhesive may cure spontaneously upon mixing (such as a 2 part epoxy adhesive) or upon exposure to air (such as a cyanoacrylate adhesive) or curing may be effected by the application of heat or radiation (such as UV light). Examples of suitable structural adhesives include epoxies, acrylates, cyanoacrylates, urethanes, and the like.

In some cases, substrate 150 provides support for multilayer construction 100. In some cases, substrate 150 is a carrier plate allowing, for example, multilayer 100 to be safely transported from one location to another, at which point the substrate may be removed. In such cases, multilayer construction 100 can be said to be in a platelet configuration. In general, substrate 150 can be any type substrate that may be desirable in an application. For example, substrate 150 can include or be made of glass and/or polymers such as polyethylene terapthalate (PET), polycarbonates, and acrylics. In some cases, the substrate can have multiple layers.

In some cases, substrate 150 can include an optical function. For example, in some cases, substrate 150 can be a light source, such as an LED light source that emits, or is capable of emitting, light at a first wavelength towards II-VI semiconductor layer 110. In such cases, II-VI semiconductor layer 110 can be a II-VI semiconductor light converting construction that absorbs, or is capable of absorbing, at least a portion of the light that is emitted by light source 150 and converts, or is capable of converting, at least a portion of the absorbed light to light at a second longer wavelength.

Multilayer construction 100 can be fabricated by first providing a II-VI semiconductor layer 110 that has a native oxide layer at a first major surface of the II-VI semiconductor layer. The II-VI semiconductor layer can be fabricated by, for example, growing the layer on an InP wafer or substrate using molecular beam epitaxy (MBE). In some cases, before II-VI semiconductor layer 110 is grown on the InP substrate, the surface of the InP substrate is first prepared for II-VI growth by growing a buffer layer, such as a GaInAs buffer layer, on the InP substrate.

Next and optionally, any contaminants that may exist on the top surface of the II-VI semiconductor are removed or etched by using, for example, an oxidizing etching process such as an oxygen plasma etching process. In some cases, the top surface of the II-VI semiconductor layer includes Se nodules that can reduce the adhesion between the II-VI semiconductor layer and a $Si_3N_4$ layer that is subsequently and directly deposited on the II-VI semiconductor layer. In such cases, it has been found that the adhesion can be significantly improved if the Se nodules are removed by using an etching process, such as an oxygen plasma etching process, a hydrogen plasma etching process, or a halogen plasma etching process such as a chlorine plasma etching process.

Next, the native oxide layer of the II-VI semiconductor layer is removed by any suitable removing or etching method. For example, the native oxide layer can be removed using a reactive ion etching (RIE) process such a RIE process that utilizes nitrogen or an element from Group VIIIA of the Periodic Table of the Elements, such as Ar; a sputtering process, such as a sputtering process that utilizes an element from Group VIIIA of the Periodic Table of the Elements, such as Ar; an ion milling process, such as an ion milling process that utilizes an element from Group VIIIA of the Periodic Table of the Elements, such as Ar; an inductive coupled plasma reactive ion etching (ICP RIE) process, such as an ICP RIE process that utilizes an element from Group VIIIA of the Periodic Table of the Elements, such as Ar; and a chemically assisted ion beam etching (CAIBE) process, such as a CAIBE process that utilizes an element from Group VIIIA of the Periodic Table of the Elements, such as Ar.

Next, a $Si_3N_4$ layer is deposited directly on top surface 102 of II-VI semiconductor layer 110. Next, an oxide layer is directly deposited on the $Si_3N_4$ layer where, in some cases, the oxide layer includes at least one of $SiO_2$, $TiO_2$, and SiON. The $Si_3N_4$ and oxide layers can be deposited using any appropriate deposition method. Exemplary deposition methods include metal-organic vapor-phase epitaxy (MOVPE), physical vapor deposition (PVD), vapor deposition such as chemical vapor deposition (CVD) and plasma enhanced chemical vapor deposition (PECVD), metal-organic vapor phase deposition (MOCVD), liquid phase epitaxy (LPE), vapor phase epitaxy (VPE), sputtering, electron beam evaporation, atomic layer deposition (ALD), flame hydrolysis, and casting.

Next, an adhesive layer is disposed directly or indirectly on the oxide layer, where, in some cases, the adhesive layer includes silicone. In some cases, a substrate 150 or a light source 150 is then adhered to the adhesive layer.

Figure 3:
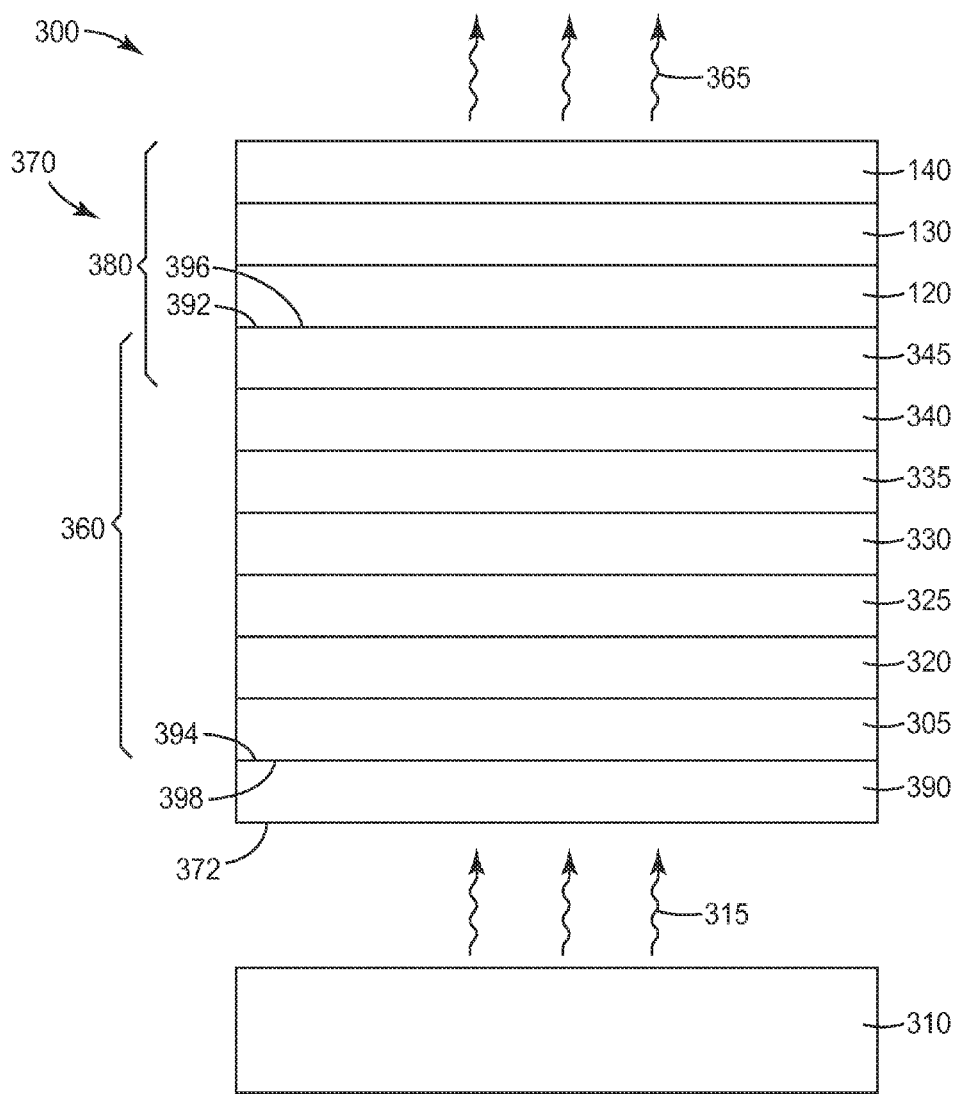
FIG. 3 is a schematic side-view of a light source assembly.

In general, II-VI semiconductor layer 110 can be any type II-VI semiconductor layer that may be of interest in an application. For example, II-VI semiconductor layer 110 can be or include a II-VI semiconductor light absorbing layer, a II-VI semiconductor potential well, a II-VI semiconductor quantum well, or a II-VI semiconductor window or window layer. For example, FIG. 3 is a schematic side-view of a light source assembly 300 that includes a light source 310 emitting light 315 at a first wavelength $\lambda_1$ and a semiconductor construction 370 that is disposed on and receives emitted light 315 from light source 310. In some cases, light source 310 is one or more LEDs emitting UV, blue, red, green, or white light.

Semiconductor construction 370 absorbs light 315 at the first wavelength $\lambda_1$ and converts at least a portion of the absorbed light to a light 365 at a longer second wavelength $\lambda_2$. Semiconductor construction 370 includes a semiconductor light converting construction 360, $Si_3N_4$ layer 120 disposed directly on semiconductor light converting construction 360, oxide layer 130 disposed directly on the $Si_3N_4$ layer, and adhesive layer 140 disposed on the oxide layer.

Semiconductor light converting construction 360 includes a first window layer 305 facing light source 310, a first light absorbing layer 320 disposed on the first window layer, a first potential well 325 disposed on the first light absorbing layer, a second light absorbing layer 330 disposed on the first potential well, a second potential well 335 disposed on the second light absorbing layer, a third light absorbing layer 340 disposed on the second potential well, and a second window layer 345 disposed on the third light absorbing layer. Semiconductor construction 370 further includes a $Si_3N_4$ layer 390 disposed directly on first window layer 390.

In the exemplary semiconductor light converting construction 360, layers 325 and 335 are potential wells. In general, each of layers 325 and 335 can be or include a potential well, a quantum well, or multiples or a plurality of each. As used herein, potential well means semiconductor layer(s) in a multilayer semiconductor structure designed to confine a carrier in one dimension only, where the semiconductor layer(s) has a lower conduction band energy than the surrounding layers and/or a higher valence band energy than the surrounding layers. Quantum well generally means a potential well which is sufficiently thin that quantization effects increase the energy for electron-hole pair recombination in the well. A quantum well typically has a thickness of about 100 nm or less, or about 10 nm or less.

In some cases, potential wells 325 and/or 335 include a II-VI semiconductor potential well that has a transition energy $E_{pw}$ that is smaller than the energy $E_1$ of a photon emitted by light source 310 at the first wavelength $\lambda_1$. In general, the transition energy of potential wells 325 and/or 335 is substantially equal to the energy $E_2$ of a photon that is re-emitted by the potential wells at the wavelength $\lambda_2$.

In some cases, potential wells 325 and/or 335 can include CdMgZnSe alloys having compounds ZnSe, CdSe, and MgSe as the three constituents of the alloy. In some cases, one or more of Cd, Mg, and Zn, especially Mg, may be absent from the alloy. For example, potential wells 325 and/or 335 can include a $Cd_{0.70}Zn_{0.30}Se$ quantum well capable of re-emitting in the red, or a $Cd_{0.33}Zn_{0.67}Se$ quantum well capable of re-emitting in the green.

The exemplary semiconductor construction 360 includes two potential wells 325 and 335. In general, semiconductor light converting construction 360 can have one or more potential wells. In some cases, construction 360 can have multiple potential wells. For example, in such cases, construction 360 can have at least 2 potential wells, or at least 5 potential wells, or at least 10 potential wells.

Light absorbing layers 320, 330, and 340 assist in absorption of light 315 and generation of carriers in semiconductor light converting construction 360. In some cases, light absorbing layers 320, 330 and 340 absorb at least a portion of light 315 and, as a result, create photo-generated carrier pairs, such as electron-hole carriers. The carriers diffuse or migrate from the light absorbing layers to potential wells 325 and 335 where they recombine and emit light at the second wavelength $\lambda_2$.

Light absorbing layers 320, 330 and 340 are placed proximate the potential wells so that the photo-generated carriers can efficiently diffuse to the potential wells for recombination of carriers and emission of light at the second wavelength $\lambda_2$. In some cases, a light absorbing layer in semiconductor light converting construction 360 can be immediately adjacent to a potential well, meaning that no intervening layer is disposed between the absorbing layer and the potential well. For example, in FIG. 3, each light absorbing layer is immediately adjacent a potential well. In some cases, a light absorbing layer in semiconductor light converting construction 360 can be closely adjacent to a potential well, meaning that one or a few intervening layers may be disposed between the absorbing layer and the potential well.

In some cases, light absorbing layers 320, 330 and 340 can be or include a II-VI semiconductor. For example, one or more or all of the light absorbing layers 320, 330 and 340 can include a CdMgZnSe semiconductor alloy.

In some cases, a light absorbing layer has a band gap energy $E_{abs}$ that is smaller than the energy $E_1$ of a photon emitted by light source 310 at the first wavelength $\lambda_1$. In such cases, the light absorbing layer can absorb light 315 that is emitted by light source 310. In some cases, $E_{abs}$ is greater than the transition energy of potential wells 325 and 335. In such cases, the light absorbing layer is substantially optically transparent to light 365 that is re-emitted by the potential wells at the second wavelength $\lambda_2$.

The exemplary semiconductor light converting construction 360 includes three light absorbing layers 320, 330 and 340. In general, the semiconductor light converting construction can have no, one, two, or more than two light absorbing layers.

In general, a light absorbing layer is sufficiently close to a corresponding potential well so that a photo-generated carrier in the light absorbing layer has a reasonable chance of diffusing to the potential well. In cases where semiconductor light converting construction 360 does not include any light absorbing layer, the potential wells can be substantially light absorbing at the first wavelength $\lambda_1$.

First and second window layers 305 and 345 are designed primarily to provide barriers so that carriers such as electron-hole pairs that are photo-generated in an absorbing layer and/or potential well, have no, or very little, chance to migrate to a free or an external surface in construction 360 or 370. For example, first window 305 is designed primarily to prevent carriers generated in first light absorbing layer 320 from migrating to external surface 372 where they can recombine non-radiatively. In some cases, window layers 305 and 345 have band gap energies $E_w$ that are greater than the energy $E_1$ of a photon emitted by light source 310 at the first wavelength $\lambda_1$. In such cases, windows 305 and 345 are substantially optically transparent to light 315 emitted by light source 310 at the first wavelength $\lambda_1$ and light 365 re-emitted by potential wells 325 and 335 at the second wavelength $\lambda_2$.

The exemplary semiconductor light converting construction 360 includes two windows. In general, construction 360 can have no, one, or two windows. For example, in some cases, semiconductor light converting construction 360 can have only first window layer 305.

Semiconductor construction 370 includes a multilayer construction 380 that is similar to multilayer construction 100 and includes second window layer 345, $Si_3N_4$ layer 120 disposed directly on the second window layer, oxide layer 130 disposed directly on the $Si_3N_4$ layer, and adhesive layer 140 disposed on the oxide layer. In cases where window layer 345 is a II-VI semiconductor, multilayer construction 380 becomes an example of multilayer construction 100 where II-VI semiconductor layer 110 is a II-VI semiconductor window layer.

In the exemplary multilayer construction 380, $Si_3N_4$ layer 120 is disposed directly on a II-VI semiconductor window layer where the band gap energy $E_w$ of the window layer is greater than the energy $E_1$ of a photon emitted by light source 310 at the first wavelength $\lambda_1$ resulting in the window layer being substantially optically transparent to light 315 emitted by light source 310 at the first wavelength $\lambda_1$ and light 365 re-emitted by potential wells 325 and 335 at the second wavelength $\lambda_2$. In general, $Si_3N_4$ layer 120 can be disposed directly on any type II-VI semiconductor layer that may be desirable in an application. For example, in some cases, $Si_3N_4$ layer 120 can be disposed directly on a II-VI semiconductor light absorbing layer similar to, for example, light absorbing layer 340, where the band gap energy $E_{abs}$ of the II-VI semiconductor light absorbing layer is smaller than the energy $E_1$ of a photon emitted by light source 310 at the first wavelength $\lambda_1$ and greater than the transition energy of potential wells 325 and 335 resulting in the light absorbing layer being substantially absorbing at the first wavelength $\lambda_1$ and substantially optically transparent at the second wavelength $\lambda_2$.

Semiconductor construction 370 is a multilayer construction that includes a first II-VI semiconductor layer 305, a second II-VI semiconductor layer 345 disposed on the first II-VI semiconductor layer, a first $Si_3N_4$ layer 390 disposed directly on first II-VI semiconductor layer 305, and a second $Si_3N_4$ layer 120 disposed directly on second II-VI semiconductor layer 345. A first interface 394 between first II-VI semiconductor layer 305 and first $Si_3N_4$ layer 390 does not include any oxide, and a second interface 392 between second II-VI semiconductor layer 345 and second $Si_3N_4$ layer 120 does not comprise any oxide.

In some cases, such as when the native oxide layers of II-VI semiconductor layers 305 and 345 are removed by an etching process that utilizes an element from Group VIIIA of the Periodic Table of the Elements, first interface 394 between first II-VI semiconductor layer 305 and first $Si_3N_4$ layer 390 includes an element from Group VIIIA of the Periodic Table of the Elements, and second interface 392 between second II-VI semiconductor layer 345 and second $Si_3N_4$ layer 120 includes an element from Group VIIIA of the Periodic Table of the Elements, such as argon.

Light source assembly 300 includes a multilayer construction that includes II-VI semiconductor construction 360 that includes one or more II-VI semiconductor layers, such as first window layer 305 and second window layer 345, a first outermost major surface 398 that includes a II-VI semiconductor, and an opposing second outermost surface 396 that includes a II-VI semiconductor. The multilayer construction also includes a first $Si_3N_4$ layer 390 that is disposed directly on first outermost major surface 398, and a second $Si_3N_4$ layer 120 that is disposed directly on second outermost major surface 396. In the exemplary light source assembly 300, II-VI multilayer construction 360 includes multiple II-VI semiconductor layers. In some cases, II-VI multilayer construction 360 includes a single II-VI semiconductor layer that has opposing outermost majors surfaces 396 and 398. In general, at least one of first and second outermost major surfaces 398 and 396 does not include any oxide. In some cases, both first and second outermost major surfaces do not include any oxide. In general, at least one of first and second outermost major surfaces 398 and 396 include an element from Group VIIIA of the Periodic Table of the Elements. In some cases, both first and second outermost major surfaces 398 and 396 include an element from Group VIIIA of the Periodic Table of the Elements.

Figure 4:
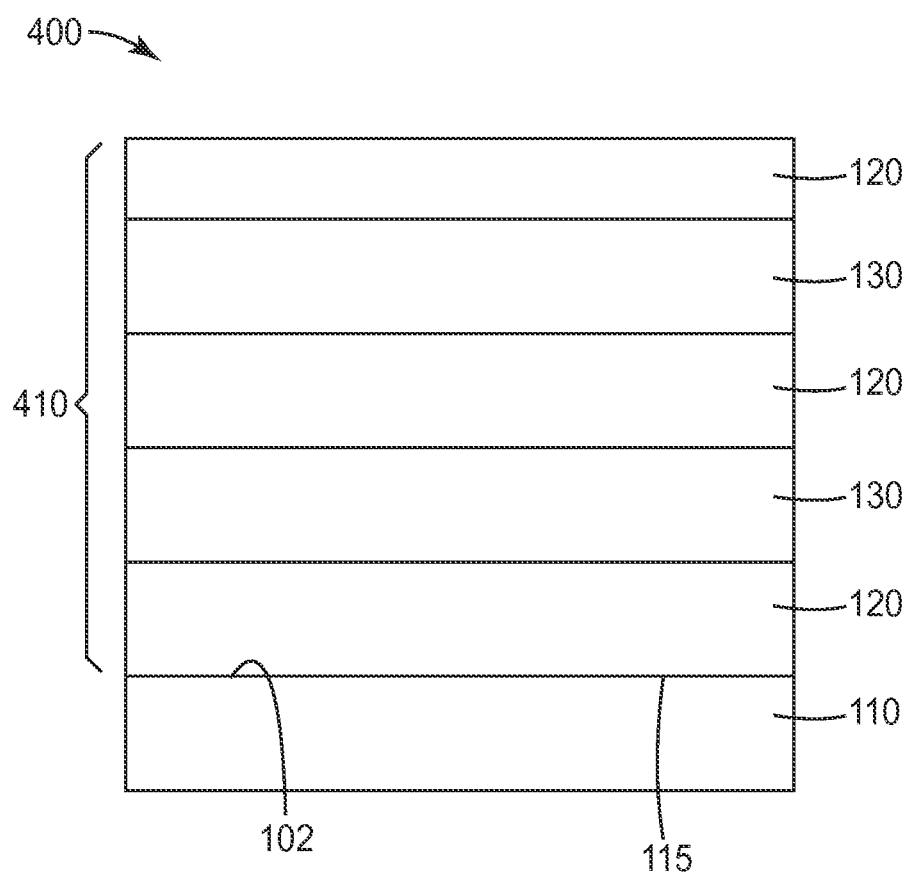
FIG. 4 is a schematic side-view of another multilayer construction.

FIG. 4 is a schematic side-view of a multilayer construction 400 that includes a mirror 410 disposed directly on II-VI semiconductor layer 110. Mirror 410 is a Bragg reflector and includes alternating $Si_3N_4$ layer 120 and oxide layer 130 with the first $Si_3N_4$ layer being disposed directly on II-VI semiconductor layer 110. Oxide layers 130 can include any oxide that has an index of refraction that is substantially different from the index of refraction of $Si_3N_4$. For example, in some cases, oxide layers 130 can be $SiO_2$ layers. In such cases, the index of the oxide layers is about 1.46 which is substantially different than the index of refraction of $Si_3N_4$ which is about 2.05. In some cases, a vertical cavity surface emitting laser (VCSEL) can include one or two multilayer constructions 400.

It has been found that the adhesion between oxide layers 130, such as $SiO_2$ layers 130, and II-VI semiconductor layer 110 is significantly improved if before depositing the first $Si_3N_4$ layer 120 directly on the II-VI semiconductor layer, the native oxide layer of the II-VI semiconductor layer at top surface 102 is removed. In such cases, the interface between the first $Si_3N_4$ and II-VI semiconductor layers does not include any oxide and can be considered to be oxide free, meaning that the average thickness of any native oxide layer at the interface between the $Si_3N_4$ and II-VI semiconductor layers is less than about 7 nanometers, or less than about 6 nanometers, or less than about 5 nanometers, or less than about 4 nanometers, or less than about 3 nanometers, or less than about 2 nanometers, or less than about 1 nanometer, or less than about 0.5 nanometer.

In some cases, oxide layer 130 can include SiON resulting in multilayer construction 400 having alternating $Si_3N_4$ layer 120 and SiON layer 130 with the first $Si_3N_4$ layer being disposed directly on II-VI semiconductor layer 110. It has been found that such multilayer construction has significantly improved environmental stability when compared to a two-layer construction 400 that includes a $Si_3N_4$ layer disposed directly on II-VI semiconductor layer 110. For example, it has been found that the layers in such a multilayer construction 400 do not delaminate even after the multilayer construction is subjected to a temperature of 85° C. and 85% humidity for up to 24 hours, or up to 36 hours, or up to 72 hours.

Multilayer construction 400 includes multiple stacks, where each stack includes an oxide layer 130 disposed directly on a $Si_3N_4$ layer 120. $Si_3N_4$ layer 120 of the bottom stack in the multiple stacks is disposed directly on II-VI semiconductor layer 110. In some cases, adjacent stacks are in direct contact with each other meaning that one stack is disposed directly on the other stack. In some cases, at least two adjacent stacks are not in direct contact with other meaning that there are one or more intervening layers between the two stacks. In some cases, the multiple stacks include at least 3 stacks, or at least 4 stacks, or at least 5 stacks, or at least 7 stacks, or at least 10 stacks. In some cases, oxide layer 130 includes at least one of $SiO_2$, $TiO_2$, and SiON.

Some of the advantages of the disclosed constructions are further illustrated by the following examples. The particular materials, amounts and dimensions recited in this example, as well as other conditions and details, should not be construed to unduly limit the present invention.

EXAMPLE 1

A semiconductor light converting construction similar to construction 360 was fabricated. The relative layer sequence, material composition, thickness, and emission wavelength, for the different layers are summarized in Table II.

TABLE II

Details of various layers in the construction of Example 1:

| Layer No. | Material | Description | Thickness (Å) | Emission wavelength (nm) |
|---|---|---|---|---|
| 1 | InP | Substrate | — | — |
| 2 | GaInAs | III-V buffer | 1900 | — |
| 3 | CdZnSe | II-VI buffer | 24 | — |
| 4 | CdMgZnSe | II-VI buffer | 1000 | — |
| 5 | CdMgZnSe | Grading layer | 2500 | — |
| 6 | CdMgZnSe:Cl | Absorber | 900 | 498 |
| 7 | CdMgZnSe | Absorber | 100 | 498 |
| 8 | CdZnSe | Quantum well | 26 | 547 |
| 9 | CdMgZnSe | Absorber | 100 | 498 |
| 10 | CdMgZnSe:Cl | Absorber | 1800 | 498 |
| 11 | CdMgZnSe | Absorber | 100 | 498 |
| 12 | CdZnSe | Quantum well | 26 | 547 |
| 13 | CdMgZnSe | Absorber | 100 | 498 |
| 14 | CdMgZnSe:Cl | Absorber | 1800 | 498 |
| 15 | CdMgZnSe | Absorber | 100 | 498 |
| 16 | CdZnSe | Quantum well | 26 | 547 |
| 17 | CdMgZnSe | Absorber | 100 | 498 |
| 18 | CdMgZnSe:Cl | Absorber | 1800 | 498 |
| 19 | CdMgZnSe | Absorber | 100 | 498 |
| 20 | CdZnSe | Quantum well | 26 | 547 |
| 21 | CdMgZnSe | Absorber | 100 | 498 |
| 22 | CdMgZnSe:Cl | Absorber | 900 | 498 |
| 23 | CdMgZnSe | Grading layer | 2500 | — |
| 24 | CdMgZnSe | Window | 1000 | 423 |

The layers were sequentially grown on an InP substrate by MBE. A GaInAs buffer layer was first grown by molecular beam epitaxy (MBE) on an InP substrate to provide a suitable surface for II-VI growth. The semiconductor light converting construction included four CdZnSe quantum wells. The emission wavelength of each quantum well was about 547 nanometers corresponding to the transition wavelength of the quantum well. The emission wavelengths of the other layers correspond to the band gap wavelengths of the layers. Each quantum well was sandwiched between CdMgZnSe absorbing layers. Some of the absorbing layers were doped with chlorine. The composition of the window layer was $Cd_{0.22}Mg_{0.45}Zn_{0.33}Se$.

EXAMPLE 2

A semiconductor light converting construction according to Example 1 was fabricated. The construction was cleaned in a nitrogen plasma. The cleaning step was sufficiently short in duration that is did not remove the native oxide layer of the window layer. Next, the construction was coated, on its window side, with a 300 nanometer thick $Si_3N_4$ layer using PECVD (PlasmaLab System 100 available from Oxford Instruments, Yatton, UK). The coating parameters are listed in Table III.

TABLE III $Si_3N_4$ coating parameters in Example 2

| Parameter | Condition |
|---|---|
| $SiH_4$ flow rate | 200 sccm |
| $NH_3$ flow rate | 20 sccm |
| $N_2$ flow rate | 500 sccm |
| Pressure | 650 mTorr |
| Temperature | 100° C. |
| High frequency (HF) power | 20 W |
| Low frequency (LF) power | 20 W |

Then, an adhesive tape was firmly applied to the surface of the $Si_3N_4$ coating. Next, the tape was peeled off at a pull direction of about 45 degrees relative to the plane of the sample. The $Si_3N_4$ layer delaminated in many areas.

EXAMPLE 3

A sample was made similar to the sample in Example 2 except that before coating the $Si_3N_4$ layer, the native oxide coating of the II-VI semiconductor window layer was removed using an Ar plasma etching process. The process conditions for the plasma etching are given in Table IV.

Table IV

Materials/Conditions used for Ar plasma process

| Parameter | Condition |
|---|---|
| Ar flow rate | 40 sccm |
| RF power | 30 W |
| ICP power | 1000 W |
| Pressure | 6 mTorr |
| Plasma etch time | 30 sec |

The Ar plasma etching process removed approximately 44 nanometers from the surface of the window layer sufficient to remove the native oxide layer. Next and before the top surface of the window layer could oxidize, a layer of $Si_3N_4$ was deposited on the window layer via the process described in Example 2. The adhesion of the $Si_3N_4$ layer was tested using the tape test described in Example 2. The $Si_3N_4$ layer did not peel or delaminate indicating that the removal of the native oxide layer significantly enhanced the adhesion of the $Si_3N_4$ layer to the II-VI semiconductor window layer.

EXAMPLE 4

A sample was made similar to the sample in Example 2, except that the thickness of the $Si_3N_4$ was 20 nanometers. Next, the $Si_3N_4$ layer was coated with a 500 nm thick $SiO_2$ layer by PECVD. The $SiO_2$ coating parameters are given in Table V.

Table V $SiO_2$ coating parameters in Example 4

| Parameter | Condition |
|---|---|
| $SiH_4$ flow rate | 80 sccm |
| $N_2O$ flow rate | 100 sccm |
| $N_2$ flow rate | 500 sccm |
| Pressure | 600 mTorr |
| Temperature | 100° C. |
| High frequency (HF) power | 70 W |
| Low frequency (LF) power | 30 W |

The adhesion of the $SiO_2$ and $Si_3N_4$ layers was tested using the tape test described in Example 2. The $SiO_2$ and $Si_3N_4$ layers delaminated in many areas.

EXAMPLE 5

A sample was made similar to the sample in Example 4, except that before coating the $Si_3N_4$ layer, the native oxide coating of the II-VI semiconductor window layer was removed using an Ar plasma etching process. The process conditions for the Ar plasma etching were the same as in Example 3, and the depositions of the $Si_3N_4$ and $SiO_2$ layers were carried out as described in Example 4. The adhesion of the $SiO_2$ and $Si_3N_4$ layers was tested using the tape test described in Example 2. The $SiO_2$ and $Si_3N_4$ layers did not peel or delaminate indicating that the removal of the native oxide layer of the II-VI semiconductor window layer significantly enhanced the adhesion of the $SiO_2$ and $Si_3N_4$ layers to the II-VI semiconductor window layer.

As used herein, terms such as "vertical", "horizontal", "above", "below", "left", "right", "upper" and "lower", "top" and "bottom" and other similar terms, refer to relative positions as shown in the figures. In general, a physical embodiment can have a different orientation, and in that case, the terms are intended to refer to relative positions modified to the actual orientation of the device. For example, even if the construction in FIG. 1 is flipped as compared to the orientation in the figure, major surface 102 of layer 110 is still considered to be the "top" major surface.

While specific examples of the invention are described in detail above to facilitate explanation of various aspects of the invention, it should be understood that the intention is not to limit the invention to the specifics of the examples. Rather, the intention is to cover all modifications, embodiments, and alternatives falling within the spirit and scope of the invention as defined by the appended claims.

What is claimed is:

1. A method of fabricating a multilayer construction comprising the steps of:
 (a) providing a II-VI semiconductor layer grown on a first substrate, the II-VI semiconductor layer comprising a native oxide layer at a first major surface of the II-VI semiconductor layer;
 (b) removing the native oxide layer;
 (c) depositing an $Si_3N_4$ layer directly on the first major surface of the II-VI semiconductor layer;
 (d) depositing an oxide layer directly on the $Si_3N_4$ layer;
 (e) disposing an adhesive layer directly on the oxide layer; and
 (g) adhering a second substrate to the oxide layer using the adhesive layer.

2. The method of claim 1, wherein step (b) comprises an ion milling of the native oxide layer.

3. The method of claim 1, wherein step (b) comprises a reactive ion etching of the native oxide layer.

4. The method of claim 1, wherein step (b) comprises an inductive coupled plasma reactive ion etching of the native oxide layer.

5. The method of claim 1, wherein step (b) comprises a chemically assisted ion beam etching of the native oxide layer.

6. The method of claim 1, wherein step (b) comprises a sputter etching of the native oxide layer.

7. The method of claim 1, wherein steps (a) through (e) are carried out sequentially.

8. The method of claim 1, wherein the adhesive layer comprises silicone.

9. The method of claim 1 further comprising the step of: (f) removing contaminants from the first major surface of the II-VI semiconductor layer.

10. The method of claim 9, wherein the steps are carried out in the following order: (a), (f), (b), (c), (d), and (e).

11. The method of claim 9, wherein the contaminants comprise Se nodules.

12. The method of claim 9, wherein step (f) comprises an oxidizing etching process.

13. The method of claim 9, wherein step (f) comprises an oxygen plasma etching process.

14. The method of claim 1, wherein adhering the second substrate to the oxide layer comprises adhering a light source to the oxide layer using the adhesive layer.

* * * * *